(12) United States Patent
Li et al.

(10) Patent No.: US 7,098,100 B1
(45) Date of Patent: Aug. 29, 2006

(54) TRENCH CAPACITOR AND METHOD FOR PREPARING THE SAME

(75) Inventors: Hui Min Li, Hsinchu (TW); Jung Wu Chien, Hsinchu (TW); Chao Hsi Chung, Hsinchu (TW); Ming Hung Lin, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 11/114,152

(22) Filed: Apr. 26, 2005

(30) Foreign Application Priority Data

Mar. 9, 2005 (TW) .............................. 94107093 A

(51) Int. Cl.
*H01L 21/8234* (2006.01)

(52) U.S. Cl. ...................... 438/238; 438/243; 438/244; 438/245; 438/246; 438/247; 438/248; 438/249; 438/250; 257/296; 257/297; 257/298; 257/299

(58) Field of Classification Search ................ 438/238, 438/243–252, 712; 257/296–313
See application file for complete search history.

(56) References Cited

U.S. PATENT DOCUMENTS

| 5,525,531 A * | 6/1996 | Bronner et al. ............. 438/152 |
|---|---|---|
| 5,736,760 A | 4/1998 | Hieda et al. |
| 5,945,704 A * | 8/1999 | Schrems et al. ............ 257/301 |
| 6,489,646 B1 | 12/2002 | Jang |
| 2005/0167721 A1* | 8/2005 | Lin et al. .................... 257/302 |

* cited by examiner

*Primary Examiner*—Ha Nguyen
*Assistant Examiner*—Kyoung Lee
(74) *Attorney, Agent, or Firm*—Oliff & Berridge, PLC

(57) ABSTRACT

The present invention discloses a trench capacitor formed in a trench in a semiconductor substrate. The trench capacitor comprises a bottom electrode positioned on a lower outer surface of the trench, a dielectric layer positioned on an inner surface of the bottom electrode, a top electrode positioned on the dielectric layer, a collar oxide layer positioned on an upper inner surface of the trench, a buried conductive strap positioned on the top electrode, and an interface layer made of silicon nitride positioned at the side of the buried conductive strap. The bottom electrode, the dielectric layer and the top electrode form a capacitive structure. The collar oxide layer includes a first block and a second block, and the height of the first block is larger than the height of the second block. The interface layer is positioned on a portion of the inner surface of the trench above the second block.

10 Claims, 8 Drawing Sheets

TRENCH CAPACITOR AND METHOD FOR PREPARING THE SAME

BACKGROUND OF THE INVENTION (A) Field of the Invention

The present invention relates to a trench capacitor and a method for preparing the same, and more particularly, to a trench capacitor for a dynamic random access memory and a method for preparing the same.

(B) Description of the Related Art

A memory cell of the dynamic random access memory (DRAM) includes an access transistor and a storage capacitor, wherein the source of the access transistor is electrically connected to a top electrode of the storage capacitor, and a bottom electrode of the storage capacitor is biased to a positive voltage. Particularly, the more the electric charges being stored in the storage capacitor, the less the occurrence of the error generated from the interpretation of data by a sensing amplifier due to the influence of noise. Therefore, current memory cells of the DRAM use 3-D capacitors, such as stacked capacitors or trench capacitors, to increase electric charges of the storage capacitor.

FIG. 1 is a cross-sectional view of a semiconductor wafer 10 for DRAM. The semiconductor wafer 10 comprises a substrate 12, two trenches 14 positioned in the substrate 12, a bottom electrode 16 positioned on the outer surface of the trench 14, a dielectric layer 18 positioned on the inner surface of the trench 14, an top electrode 20 positioned on the surface of the dielectric layer 18, a collar oxide layer 22 positioned on the inner surface of the trench 14, a buried conductive strap 24 positioned on the top electrode 20 and a shallow trench isolation (STI) 26 filled with dielectric material. A conductive diffusion region 28 is formed at the side of the buried conductive strap 24 to electrically connect the buried conductive strap 24 to a drain electrode/source electrode 32 of the access transistor. The bottom electrode 16, the dielectric layer 18 and the top electrode 20 in each trench 14 form a capacitive structure 30. The shallow trench isolation 26 is used to prevent two neighboring capacitive structures 30 from being a short circuit.

To avoid the two capacitive structures 30 being a short circuit and to ensure that an identical contact area between the buried conductive strap 24 and the corresponding top electrode 20 is achieved so as to obtain identical contact resistance, the position of the shallow trench isolation 26 must be precisely controlled. In addition, as the integration density of integrated circuit increases rapidly, the interval between the two capacitive structures 30 reduces correspondingly, i.e., the lateral width of the shallow trench isolation 26 must be reduced. However, the lithographic process, which is used to define the position and the size of the shallow trench isolation 26, tends to generate misalignment as the size shrinks. Consequently, the position of the shallow trench isolation 26 deviates from the predetermined position due to the misalignment of the lithographic process, which results in the occurrence of short circuit between the two capacitive structures 30. That also leads to different contact area (contact resistance) between the buried conductive strap 24 and the corresponding top electrode 20 for the two capacitive structures 30.

SUMMARY OF THE INVENTION

The objective of the present invention is to provide a trench capacitor for a dynamic random access memory and a method for preparing the same, which possesses a larger process window than the prior art, and can eliminate dangling bonds on an exposed surface of a semiconductor substrate.

In order to achieve the above-mentioned objective and avoid the problems of the prior art, the present invention discloses a trench capacitor for a dynamic random access memory and a method for preparing the same. The trench capacitor formed in at least one trench in a semiconductor substrate comprises a bottom electrode positioned on a lower outer surface of the trench, a dielectric layer positioned on a lower inner surface of the trench, a top electrode positioned on the dielectric layer, a collar oxide layer positioned on an upper inner surface of the trench, a buried conductive strap positioned on the top electrode, and an interface layer made of silicon nitride positioned at the side of the buried conductive strap. The bottom electrode, the dielectric layer and the top electrode form a capacitive structure. The collar oxide layer includes a first block and a second block, and the height of the first block is larger than the height of the second block. The interface layer is positioned on a portion of the inner surface of the trench above the second block.

The method for preparing a trench capacitor first forms at least one trench in a semiconductor substrate, and a capacitive structure is then formed at a lower portion of the trench, wherein the capacitive structure includes a bottom electrode positioned on a lower outer surface of the trench, a dielectric layer positioned on an inner surface of the bottom electrode, and a top electrode positioned on the dielectric layer. A collar oxide layer is formed on an upper inner surface of the trench, and a predetermined portion of the collar oxide layer is then removed to form a first block and a second block. An interface layer made of silicon nitride is formed on a portion of the inner surface of the trench above the second block in a nitrogen-containing atmosphere, and a buried conductive strap is formed on the top electrode. The first block of the collar oxide layer is used to isolate two adjacent trench capacitors from the occurrence of short circuit.

Compared to the prior art using a shallow trench isolation to prevent the trench capacitors from being a short circuit, the present invention uses the first block of the collar oxide layer to isolate two adjacent capacitive structures so as to avoid the occurrence of the short circuit between the two adjacent capacitive structures. Using the first block as isolation also requires a smaller space. In addition, the etching process performed after the first block and the second block have been formed will not substantially etch the collar oxide layer. Consequently, there is a larger process window using the first block to isolate the two adjacent capacitive structures, and the trench capacitor can be used in a smaller fabrication generation. Furthermore, since the dangling bond on the exposed surface of the semiconductor substrate may reduce the mobility of carriers, the interface layer is formed on the exposed surface of the semiconductor substrate to eliminate dangling bonds according to the present invention.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
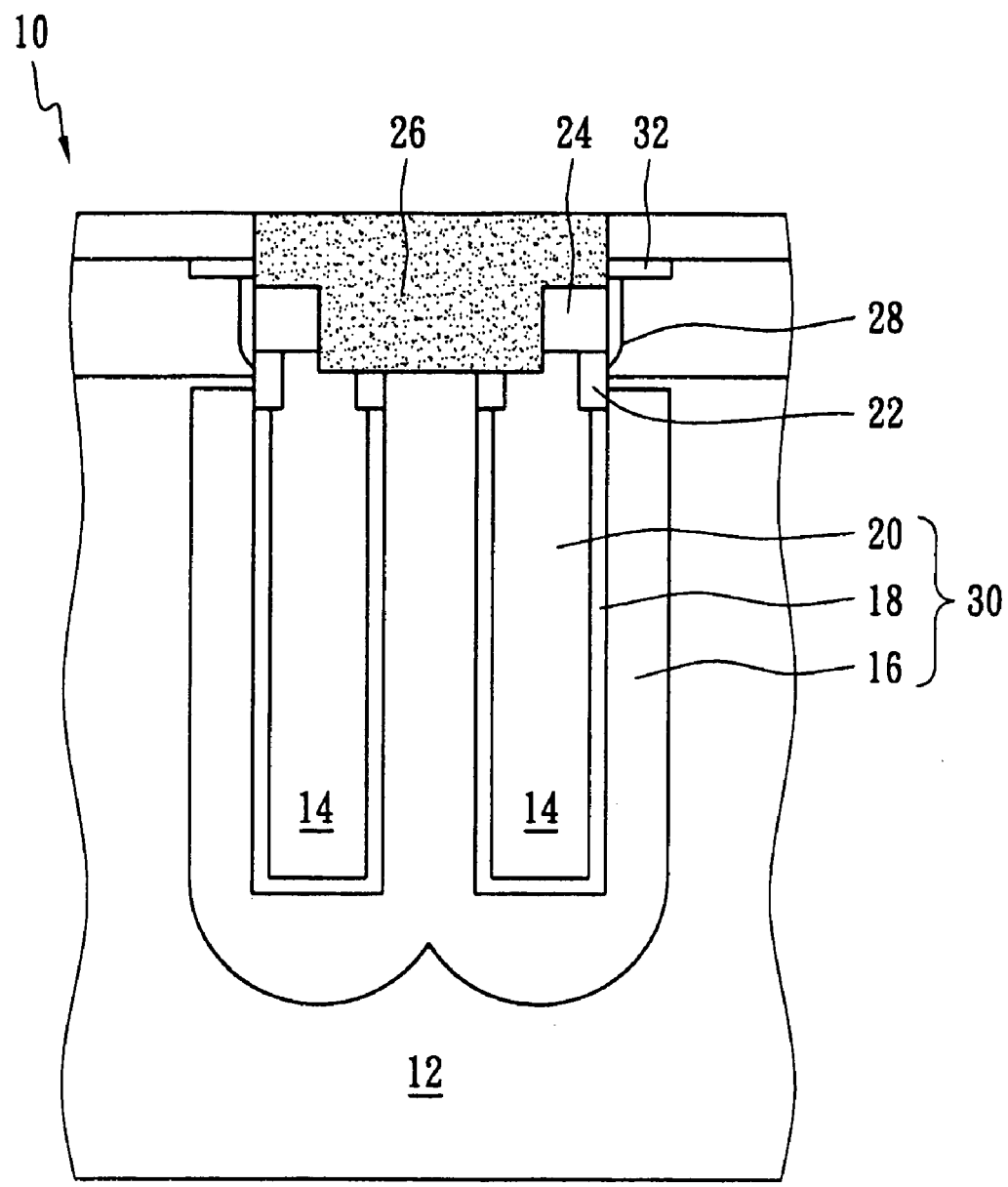
FIG. 1 is a cross-sectional view of a semiconductor wafer for DRAM.
Figure 2:
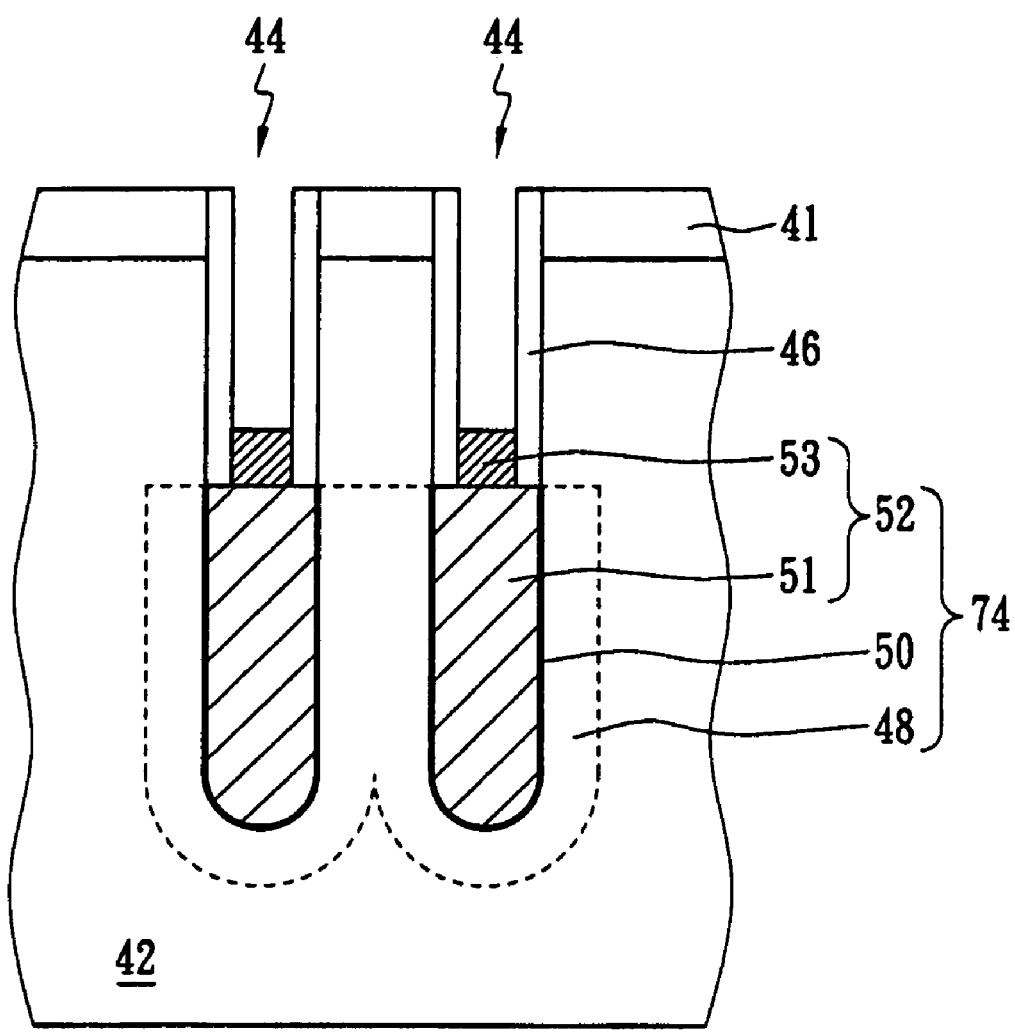
FIGS. 2 to 8 illustrate a method for preparing a trench capacitor according to one preferred embodiment of the present invention.

FIGS. 2 to 8 illustrate a method for preparing a trench capacitor 76 according to one preferred embodiment of the present invention. Referring to FIG. 2, after two adjacent trenches 44 are formed in a semiconductor substrate 42 with a silicon nitride layer 41 thereon, a bottom electrode 48 is formed on a lower outer surface of the trench 44, a dielectric layer 50 is formed on a lower inner surface of the trench 44, and a conductive layer 51 is formed on the dielectric layer 50 in sequences. A collar oxide layer 46 is then formed on an upper inner surface of the trench 44 by a thermal oxidation process (or chemical vapor deposition process) incorporating an anisotropic etching process. Another conductive layer 53 is formed on the conductive layer 51 to construct a top electrode 52. The bottom electrode 48, the dielectric layer 50 and the top electrode 52 form a capacitive structure 74.

Figure 3:
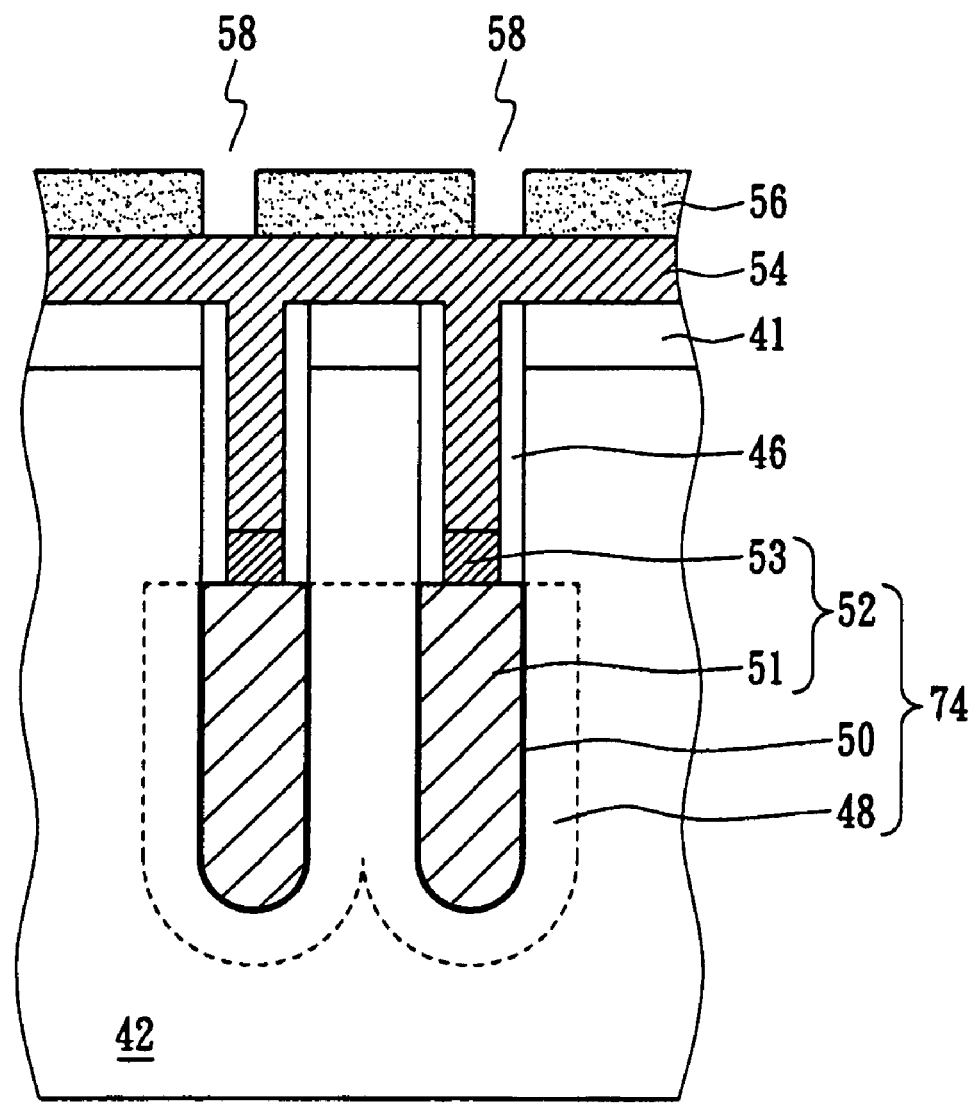
Figure 4:
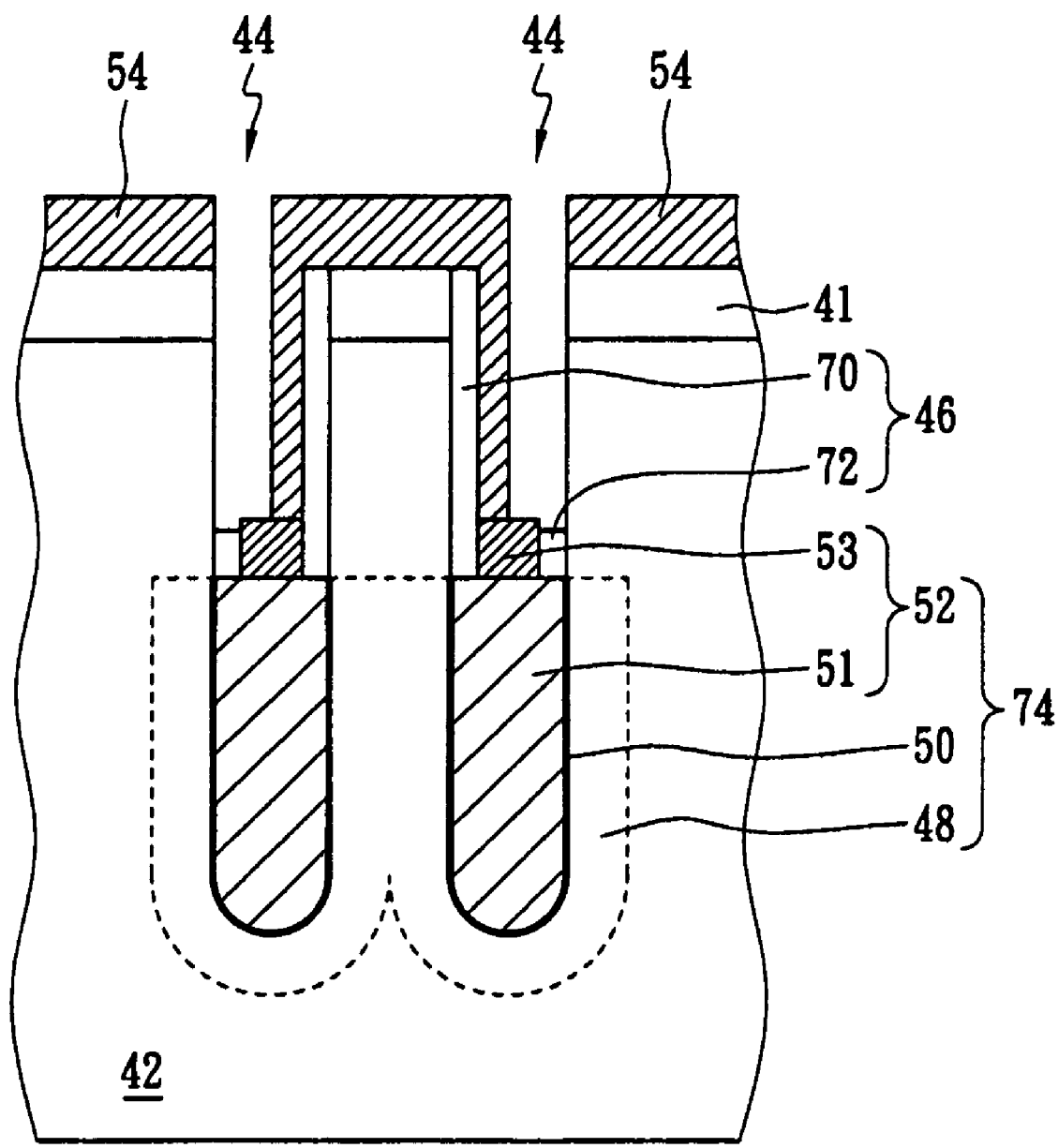

Referring to FIGS. 3 and 4, a polysilicon layer 54 is formed on the semiconductor substrate 42, and a photoresist layer 56 is then formed on the polysilicon layer 54, wherein the photoresist layer 56 includes an opening 58 exposing a predetermined region of the collar oxide layer 46. Etching gases including sulfur hexafluoride ($SF_6$) are used to perform a dry etching process to remove a portion of the polysilicon layer 54 below the opening 58 down to a first predetermined depth, such as down to the surface of the conductive layer 53. After the photoresist layer 56 is removed, a diluted hydrofluoric acid is used to perform a wet etching process to remove a portion of the collar oxide layer 46 below the opening 58 to a second predetermined depth so that the collar oxide layer 46 is divided into a first block 70 and a second block 72, and the height of the first block 70 is larger than the height of the second block 72.

Preferably, the second predetermined depth from the surface of the substrate 42 generated by the wet etching process is larger than the first predetermined depth from the surface of the substrate 42 generated by the dry etching process so that the upper end of the second block 72 is lower than the upper surface of the conductive layer 53. Particularly, the first block 70 is positioned on a portion of the inner surface of one of the two adjacent trenches 44 facing each other, while the second block 72 is positioned on a portion of the inner surface of one of the two adjacent trenches 44 far away from the other. The lateral thickness of the collar oxide layer 46 is preferably in a range between 200 and 400 angstroms. The reaction temperature for the wet etching process is preferably conducted in a range between 20° C. and 30° C., and the volumetric ratio of the fluoric acid to water for the diluted fluoric acid is between 1:50 and 1:100.

Figure 5:
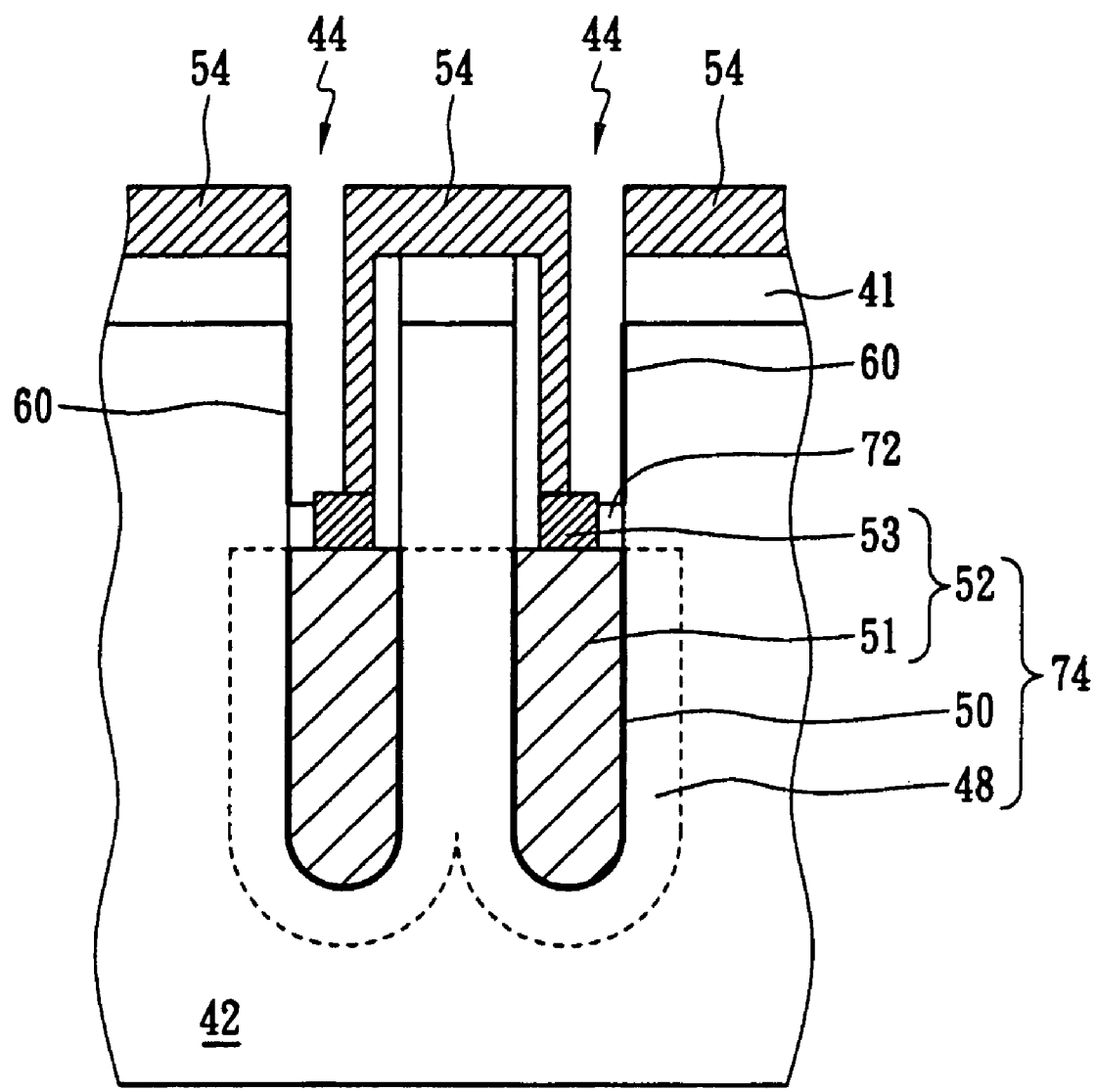

Referring to FIG. 5, the semiconductor substrate 42 is thermally treated in a nitrogen-containing atmosphere, and an interface layer 60 is formed on the inner surface of the trench 44 above the second block 72. A portion of the surface of the semiconductor substrate 42 inside the trench 44, i.e., the portion of the semiconductor substrate 42 above the second block 72, is exposed when the collar oxide layer 46 below the opening 58 is removed by the wet etching process, and there are dangling bonds induced on the exposed surface of the semiconductor substrate 42. Since carriers tend to be trapped by dangling bonds, the overall number of moving carriers is reduced; hence the dangling bond is unfavorable to the movement of carriers. In order to eliminate the dangling bonds on the exposed surface of the semiconductor substrate 42, the semiconductor substrate 42 is positioned in a nitrogen-containing atmosphere, such as in a chamber containing nitrogen, to perform a thermal treating process so that the interface layer 60 made of silicon nitride is formed on the inner surface of the trench 44 above the second block 72. The lateral thickness of the interface layer 60 is preferably in a range between 5 and 15 angstroms, and the thermal treating temperature is preferably in a range between 650° C. and 750° C.

Figure 6:
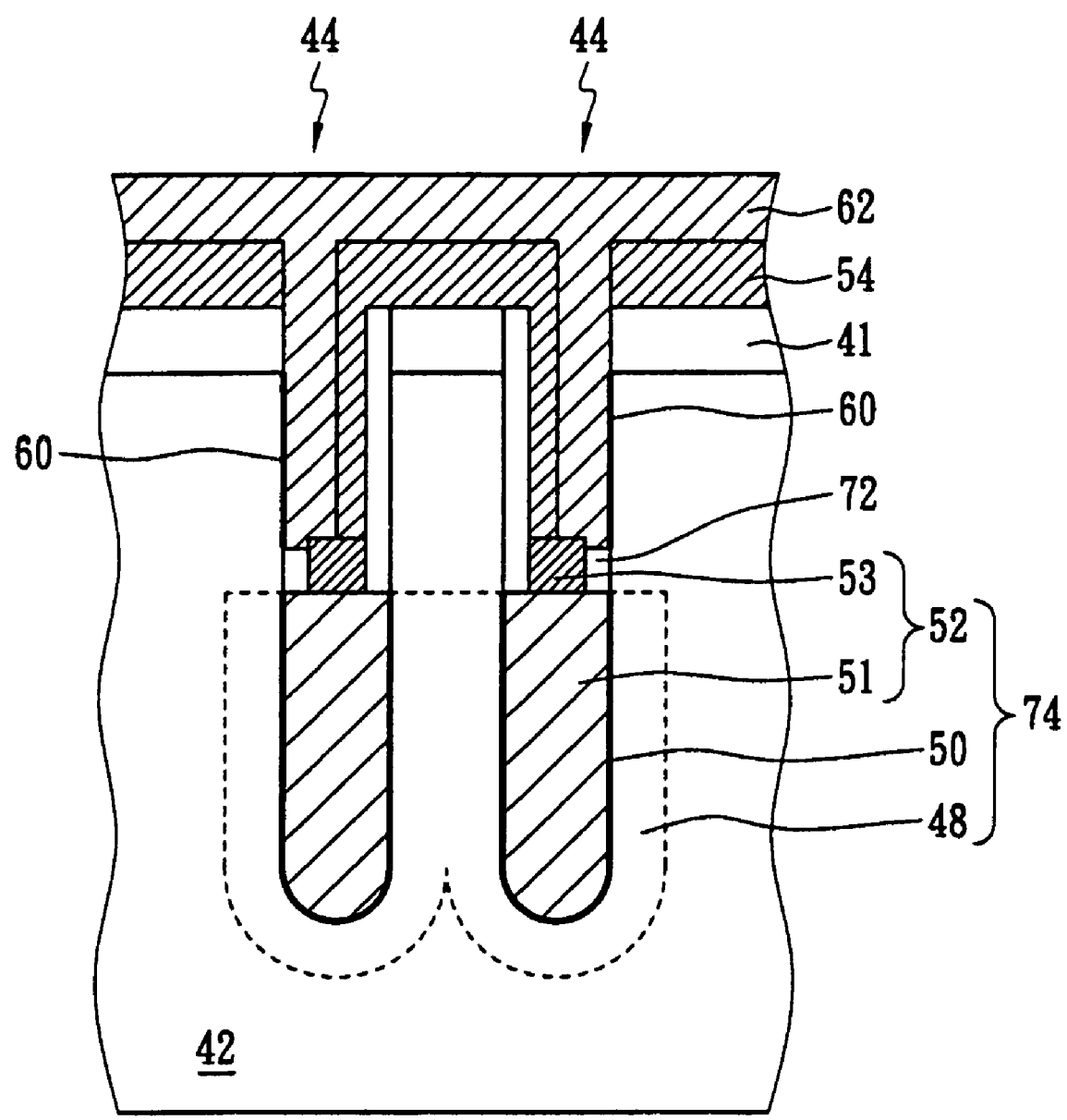
Figure 7:
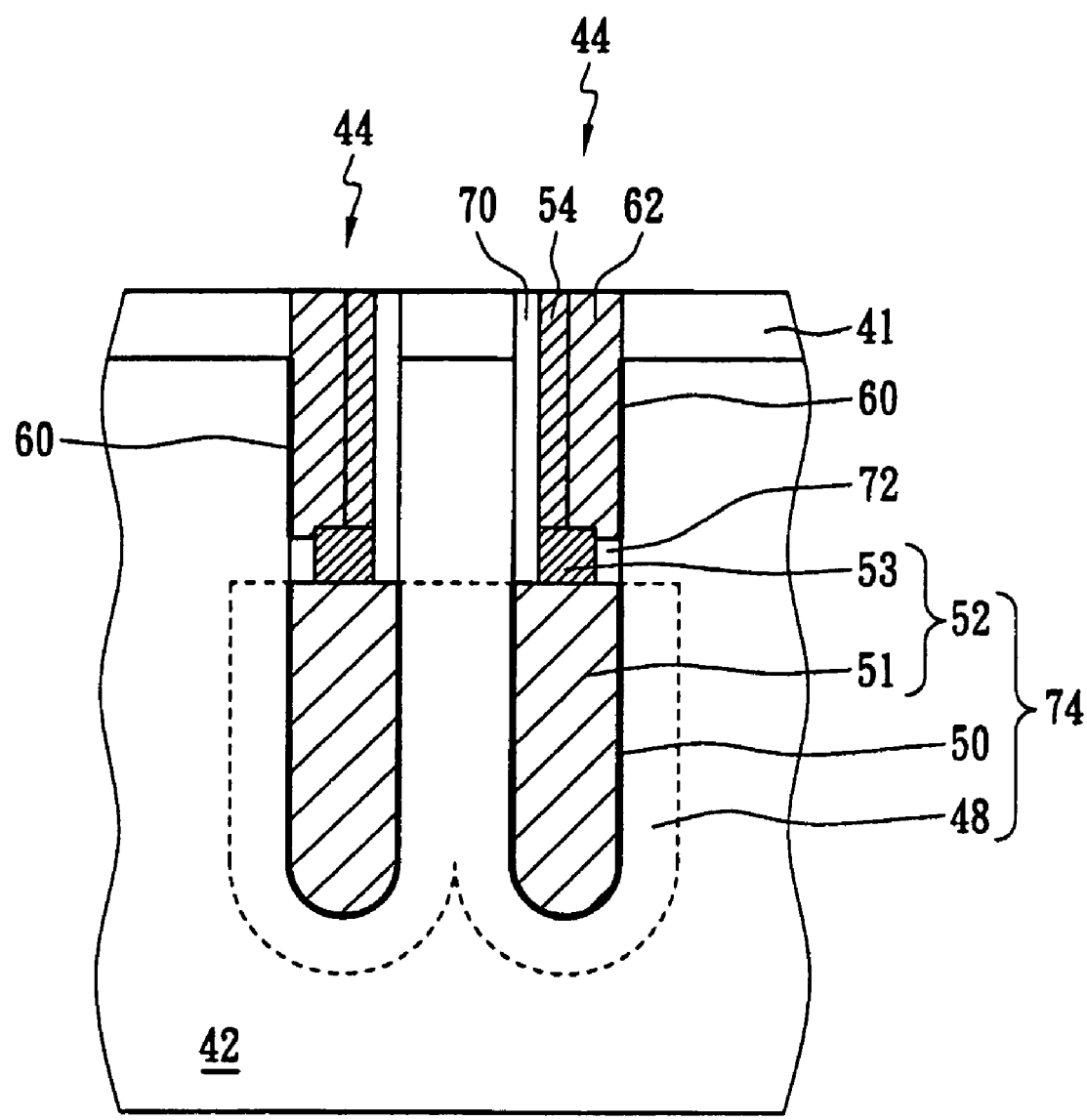

Referring to FIGS. 6 and 7, a polysilicon layer 62 is formed on the semiconductor substrate 42, and the polysilicon layer 62 fills the trenches 44. A planarizing process, such as a chemical mechanical polishing process, is performed to remove a portion of the polysilicon layer 54 and the polysilicon layer 62 on the surface of the semiconductor substrate 42. The chemical mechanical polishing process may be terminated using the silicon nitride layer 41 as the polishing stop layer.

Figure 8:
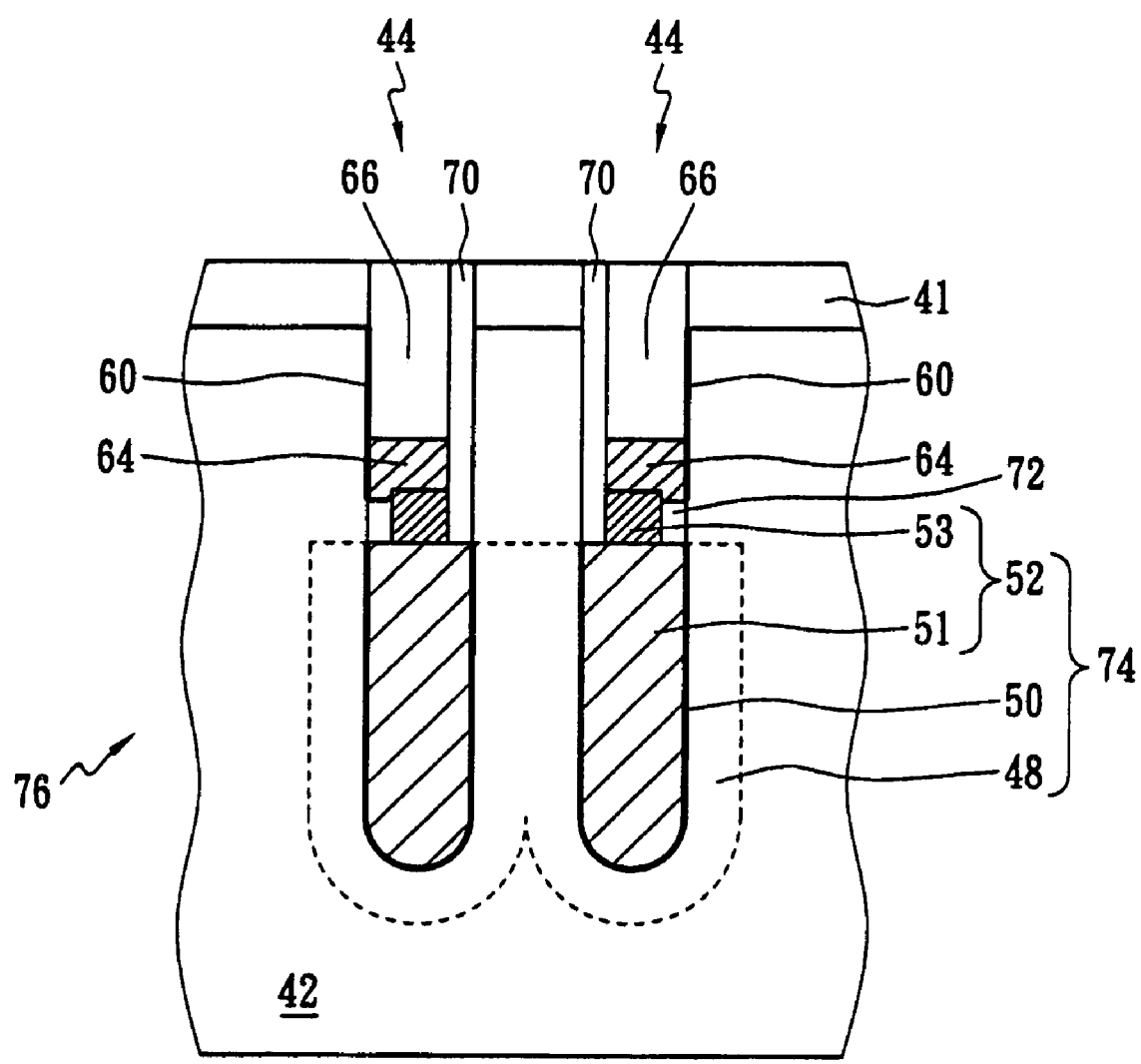

Referring to FIG. 8, etching gases containing sulfur hexafluoride are used to perform a dry etching process to remove a portion of the polysilicon layer 54 and a portion of the polysilicon layer 62 in the trenches 44 down to a third predetermined depth to form a buried conductive strap 64 on the conductive layer 53. Particularly, the height of the first block 70 is larger than the height of the buried conductive strap 64. After the active area is defined, a dielectric layer 66 is formed on the buried conductive strap 64. The dielectric layer 66 can be prepared by a high density plasma chemical vapor deposition (HDP-CVD) process using tetra ethyl ortho silicate (TEOS) as one of precursors, and by a chemical mechanical polishing process for planarizing the upper surface of the dielectric layer 66. The top electrode 52 of the capacitive structure 74 is electrically connected to a diffusion region (the source/drain of MOS transistor) subsequently formed at the side of the interface layer 60 through the buried conductive strap 64.

Compared to the prior art using a shallow trench isolation to prevent the trench capacitors from the occurrence of short circuit, the present invention uses the first block 70 of the collar oxide layer 46 to isolate the two adjacent capacitive structures 74 so as to avoid the occurrence of short circuit between the two adjacent capacitive structures 74. Using the first block 70 as isolation requires a smaller space, and thus the trench capacitor can be applied to a smaller fabrication generation. The etching processes performed after the first block 70 and the second block 72 have been formed will not etch the collar oxide layer 46, and consequently there is a larger process window using the first block 70 to isolate the two adjacent capacitive structures 74. Furthermore, since the dangling bonds on the exposed surface of the semiconductor substrate 42 may reduce the mobility of carriers, the interface layer 60 is formed on the exposed surface of the semiconductor substrate 42 to eliminate dangling bonds according to the present invention.

The above-described embodiments of the present invention are intended to be illustrative only. Numerous alternative embodiments may be devised by those skilled in the art without departing from the scope of the following claims.

What is claimed is:

1. A method for preparing a trench capacitor, comprising steps of:

forming at least one trench in a semiconductor substrate;

forming a collar oxide layer on an upper inner surface of the trench;

removing a predetermined portion of the collar oxide layer to form a first block and a second block, including:

forming a first polysilicon layer on the semiconductor substrate;

forming a photoresist layer on the first polysilicon layer, wherein the photoresist layer includes an opening exposing the second block;

performing a dry etching process to remove a portion of the first polysilicon layer below the opening down to a first predetermined depth; and performing a wet etching process to remove a portion of the collar oxide layer below the opening down to a second predetermined depth so as to form the first block and the second block of the collar oxide layer, wherein the height of the first block is larger than the height of the second block, and forming an interface layer on a portion of the inner surface of the trench above the second block.

2. The method for preparing a trench capacitor of claim 1, further comprising steps performed before forming a collar oxide layer on an inner upper surface of the trench:

forming a bottom electrode on a lower outer surface of the trench;

forming a dielectric layer on an inner surface of the bottom electrode; and forming a top electrode on the surface of the dielectric layer.

3. The method for preparing a trench capacitor of claim 1, wherein the dry etching process comprises using etching gases including sulfur hexafluoride.

4. The method for preparing a trench capacitor of claim 1, wherein the wet etching process is performed at a temperature between 20° C. and 30° C.

5. The method for preparing a trench capacitor of claim 1, wherein the wet etching process comprises using an etching solution including fluoric acid and water.

6. The method for preparing a trench capacitor of claim 5, wherein the volumetric ratio of fluoric acid to water is between 1:50 and 1:100.

7. The method for preparing a trench capacitor of claim 1, wherein the step of forming an interface layer on a portion of the inner surface of the trench above the second block comprises thermally treating the semiconductor substrate in a nitrogen-containing atmosphere so as to form the interface layer made of silicon nitride on the inner surface of the trench.

8. The method for preparing a trench capacitor of claim 7, wherein the step of forming an interface layer on a portion of the inner surface of the trench above the second block is performed at a temperature between 650° C. and 750° C.

9. The method for preparing a trench capacitor of claim 1, further comprising steps of:

forming a second polysilicon layer on the semiconductor substrate;

performing a planarizing process to remove a portion of the second polysilicon layer on the surface of the semiconductor substrate; and performing a dry etching process to remove a portion of the first polysilicon layer and a portion of the second polysilicon layer down to a third predetermined depth to formed a buried conductive strap on a top electrode of a trench capacitor, wherein the buried conductive strap includes the first polysilicon layer and the second polysilicon layer.

10. The method for preparing a trench capacitor of claim 9, further comprising steps of:

forming a second dielectric layer on the buried conductive layer; and planarizing the second dielectric layer.

* * * * *